United States Patent [19]

Whitwell et al.

[11] Patent Number: 4,765,866

[45] Date of Patent: Aug. 23, 1988

[54] ENERGY RAY CURING OF ARYLSILOXANE/SILICATE COMPOSITIONS AND SUBSEQUENT ETCHING THEREOF

[75] Inventors: George E. Whitwell, Campbell Hall; John H. Deatcher, Lake Peekskill, both of N.Y.; Andrea Leone-Bay, Ridgefield, Conn.

[73] Assignee: Akzo America Inc., New York, N.Y.

[21] Appl. No.: 101,522

[22] Filed: Sep. 28, 1987

Related U.S. Application Data

[63] Continuation-in-part of Ser. No. 069,088, Jul. 2, 1987.

[51] Int. Cl.[4] .......................... B44C 1/22; B29C 37/00
[52] U.S. Cl. ..................................... 156/668; 156/643; 252/79.3
[58] Field of Search ..................... 156/655, 659.1, 668, 156/643; 204/157.74; 252/79.3; 427/43, 54.1, 95, 387; 428/447, 448; 528/30

[56] References Cited

U.S. PATENT DOCUMENTS

| | | | |
|---|---|---|---|
| 4,041,190 | 8/1977 | Dubois et al. | 427/43 |
| 4,349,609 | 9/1982 | Takeda et al. | 428/429 |
| 4,600,685 | 7/1986 | Kitakohji et al. | 430/313 |
| 4,663,414 | 5/1987 | Estes et al. | 528/30 |

*Primary Examiner*—William A. Powell
*Attorney, Agent, or Firm*—Richard P. Fennelly; Francis W. Young; Louis A. Morris

[57] ABSTRACT

The etching of cured arylsiloxane/silicate resin coatings with HF is improved if the curing of said coatings, prior to etching, comprises curing with energy ray irradiation.

8 Claims, No Drawings

ENERGY RAY CURING OF ARYLSILOXANE/SILICATE COMPOSITIONS AND SUBSEQUENT ETCHING THEREOF

This is a continuation-in-part of U.S. Ser. No. 69,088, filed July 2, 1987, entitled "Arylsiloxane/Silicate Compositions Useful as Interlayer Dielectric Films".

BACKGROUND OF THE INVENTION

1. Field of the Invention

The present invention relates to the curing of arylsiloxane/silicate compositions and their subsequent etching in the fabrication of electronic devices.

2. Description of the Prior Art

Various disclosures exist in the art in regard to the curing of siloxane-type polymers in the fabrication of coatings or layers suitable for use in electronic devices. For example, U.S. Pat. No. 4,041,190 to J. Dubois et al. teaches that a polyvinylsiloxane resin can be irradiated by an electron beam to convert the resin to an insoluble product in the areas exposed. Non-bombarded areas are said to be thereafter eliminated "with the help of a solvent" (Col. 4, line 7) which is not further identified. U.S. Pat. No. 4,349,609 to S. Takeda et al. teaches the thermal curing of ladder-type silsesquioxane polymers and also discloses the subsequent etching of the cured material with hydrofluoric acid (HF)-containing etchants (Col. 6, lines 48–61). The irradiation of ladder-type organosiloxane resins with energy rays is disclosed in U.S. Pat. No. 4,600,685 to T. Kitakohji et al., but no discussion is contained in this patent in regard to any etching of the cured resin material produced from the irradiation step.

SUMMARY OF THE PRESENT INVENTION

The present invention relates to the unexpected finding that an HF-containing etchant is more effective in the etching of a cured arylsiloxane/silicate resin if the curing step comprises the use of energy rays.

DETAILED DESCRIPTION OF THE PRESENT INVENTION

The preferred arylsiloxane/silicate compositions which are treated to energy ray curing and then HF etching in accordance with the present invention are described in the aforementioned U.S. Ser. No. 69,088, filed on July 2, 1987, which is incorporated herein by reference. These compositions have the general preferred structure.

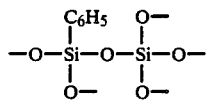

and are conveniently formed by reaction of a trifunctional silanetriol or derivative thereof with a tetrafunctional silicic acid compound. The silanetriol or derivative has the formula $Ar-Si-(Z)_3$ with Ar being substituted or unsubstituted aryl and Z being a group capable of participating in the desired co(hydrolysis/condensation) reaction, for example: halogen; alkoxy; hydroxy; and the like. The silicic acid compound has the formula $Si(Y)_4$ with Y being chosen for reaction with the moiety Z: alkoxy; halogen; and the like. If desired, heteroatoms (phosphorus, boron, and the like) can be included by the additional inclusion, for example, of hydroxy compounds containing them as described in greater detail in the aforementioned application.

The arylsiloxane/silicate compositions can be admixed with appropriate solvents and can then be appropriately used in spin-on deposition processes to yield interlayer dielectric films which are suitably curable.

In accordance with the present invention, the liquid films are cured by energy rays of the type described in U.S. Pat. No. 4,600,685: electron beam irradiation; proton irradiation; X-ray irradiation; ultraviolet ray irradiation; and the like. Ultraviolet ray irradiation has been found, for example, to be useful in accordance with the present invention by employing a mercury lamp with exposure times of from about 20 to about 60 minutes. It is possible to thermally pre-cure or post-cure the energy ray-cured films to remove residual solvent and/or effect condensation by heating (e.g., at temperatures of 100° to 350° C.) for a sufficient length of time (e.g., 5 minutes to 1 hour) to complete the cure.

The cured arylsiloxane/silicate films are then subjected to an etching step using an etchant which comprises HF. Preferably, buffered HF compositions comprising HF and ammonium fluoride are employed. Surprisingly, as demonstrated in Example 3, which follows, the use of an energy ray curing step allows for better etching of the cured film than is possible with use of a curing step consisting entirely of a thermal cure procedure.

The present invention is further illustrated by the Examples which follow.

EXAMPLE 1

This Example illustrates formation of the polysiloxane interlayer dielectric solution utilized in the Examples which follow (Examples 2–4).

Phenylsilanetriol (404.1 grams) was dissolved in a xylene solvent (1050 grams) with stirring in a two liter, three-neck flask fitted with a nitrogen gas adapter and a Dean-Stark trap. Phenylphosphonic acid (13.5 grams) was dissolved in isopropanol (150 grams), then triisopropylborate (32.4 grams) was added and dissolved in the isopropanol. The resulting isopropanol solution was added to the xylene solution and was stirred for 15 minutes. When the solution reached 137° C., refluxing was continued for 1 hour. The solution was cooled under a nitrogen gas flow and was then filtered through a 5 micron filter made of TEFLON fluorocarbon polymer. The final weight percent solids for the resulting interlayer dielectric solution was 31.4%.

EXAMPLE 2

The polysiloxane ILD solution from Example 1 was used to spin films of approximately 8000 Angstroms (A) in thickness on 2-inch diameter silicon wafers. These films were exposed to UV radiation (Hg lamp) through an aluminum foil screen for various exposure times. The exposed films were treated with xylenes and the unexposed portions were rinsed off.

| Sample | Expose Time | Results |
|---|---|---|
| A | 5 min. | Distinct image<br>Film partially attacked |
| B | 20 min. | Distinct image<br>Film extracted from under surface |
| C | 30 min. | Distinct image<br>Film extracted from under surface less than B |
| D | 60 min. | Very distinct image |

| Sample | Expose Time | Results |
|---|---|---|
| | | Sharper than C with little extraction from under surface |

In another experiment, a film was exposed for 60 minutes, but left for 12 hours before treating with xylenes. No differences were observed between this sample and A.

EXAMPLE 3

Films of the ILD solution from Example 1 of approximately 1 micron thickness were spun onto 2-inch diameter silicon wafers. One such film was cured for 20 minutes at 350° C. and then treated with buffered HF for 5 minutes. The film was only slightly etched. A second film was exposed to UV radiation (Hg lamp) for 1 hour and then cured at 350° C. for 20 minutes. This film was completely removed by the buffered HF solution in 5 minutes.

This example illustrates the unexpectedly enhanced etching which resulted when an ultraviolet light-cured resin was treated with buffered HF etchant as compared to a similar treatment of a thermally-cured resin only.

EXAMPLE 4

An ILD film from the solution of Example 1 was spun onto a 2-inch wafer at 3000 rpm and exposed to UV radiation (Hg lamp) for 2 hours: ellipsometric thickness—8100 A. Three more ILD layers were added on top of the first with 30-minute UV treatments in between each spin deposition: ellipsometric thicknesses—22370 A, 39750 A and 42500 A.

The foregoing Examples are intended to illustrate certain embodiments of the present invention and should, therefore, not be construed in a limiting sense. The scope of protection that is sought is set forth in the claims which follow.

We claim:

1. A process for the etching of a cured arylsiloxane/silicate resin coating which comprises curing a liquid coating of the arylsiloxane/silicate resin at least partially with energy ray irradiation and subsequently etching the cured coating with an etchant comprising HF.

2. A process as claimed in claim 1 wherein the resin is formed by reaction of a trifunctional silanetriol, or derivative, with a silicic acid compound.

3. A process as claimed in claim 1 wherein ultraviolet light irradiation is used.

4. A process as claimed in claim 2 wherein ultraviolet light irradiation is used.

5. A process as claimed in claim 1 wherein buffered HF is used.

6. A process as claimed in claim 2 wherein buffered HF is used.

7. A process as claimed in claim 3 wherein buffered HF is used.

8. A process as claimed in claim 4 wherein buffered HF is used.

* * * * *